US 6,740,910 B2

(12) United States Patent
Roesner et al.

(10) Patent No.: US 6,740,910 B2
(45) Date of Patent: May 25, 2004

(54) FIELD-EFFECT TRANSISTOR, CIRCUIT CONFIGURATION AND METHOD OF FABRICATING A FIELD-EFFECT TRANSISTOR

(75) Inventors: Wolfgang Roesner, Ottobrunn (DE); Richard Johannes Luyken, München (DE); Johannes Kretz, München (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/352,830

(22) Filed: Jan. 28, 2003

(65) Prior Publication Data

US 2003/0132461 A1 Jul. 17, 2003

Related U.S. Application Data

(63) Continuation of application No. PCT/DE01/02708, filed on Jul. 19, 2001.

(30) Foreign Application Priority Data

Jul. 28, 2000 (DE) .......................... 100 36 897

(51) Int. Cl.$^7$ ............................... H01L 29/76
(52) U.S. Cl. .................. 257/213; 257/24; 257/250; 257/302; 257/368; 257/499; 438/156; 438/173; 438/192; 438/206; 438/212; 438/268
(58) Field of Search .................. 257/9, 15, 24, 257/30, 213, 250, 220, 242, 263, 278, 302, 328, 314, 368, 499, 565; 438/156, 158, 173, 192, 206, 212, 268

(56) References Cited

U.S. PATENT DOCUMENTS

| | | | | |
|---|---|---|---|---|
| 6,361,861 B2 | * | 3/2002 | Gao et al. | 428/367 |
| 6,515,325 B1 | * | 2/2003 | Farnworth et al. | 257/296 |
| 6,566,704 B2 | * | 5/2003 | Choi et al. | 257/314 |
| 2002/0163079 A1 | * | 11/2002 | Awano | 257/750 |

FOREIGN PATENT DOCUMENTS

| | | |
|---|---|---|
| DE | 42 35 152 A1 | 4/1994 |
| EP | 1 063 694 A1 | 12/2000 |
| WO | WO 00/51186 | 8/2000 |

OTHER PUBLICATIONS

Dekker, C.: "Carbon Nanotubes as Molecular Quantum Wires", Physics Today, Amerian Institute of Physics, vol. 52, No. 5, May 1999, pp. 22–28.
Shea, H.R. et al.: "Manipulation of Carbon Nanotubes and Properties of Nanotube Field–Effect Transistors and Rings", Microelectric Engineering, Elsevier Sicence B.V., vol. 46, No. 1–4, May 1999, pp. 101–104.
R. Müller: "Bauelemente der Halbleiter–Elektronik" [components of semiconductor electronics], *2nd., revised ed., Springer Verlag*, Berlin, 1979, pp. 130–163.
Z. F. Ren: "Synthesis of Large Arrays of Well–Aligned Carbon Nanotubes on Glass", *Science*, vol. 282, Nov. 6, 1998, pp. 1105–1107.
N. Wang et al.: "Si nanowires grown from silicon oxide", *Chemical Physics Letters*, No. 299, 1999, pp. 237–242.
D. Golberg et al.: "Fine structure of boron nitride nanotubes produced from carbon nanotubes by a substitution reaction", *Journal of Applied Physics*, vol. 86, No. 4, Aug. 15, 1999, pp. 2364–2366.
Jung Sang Suh et al.: "Highly ordered two–dimensional carbon nanotube arrays", *Applied Physics Letters*, vol. 75, No. 14, Oct. 4, 1999, pp. 2047–2049.

* cited by examiner

*Primary Examiner*—David Nelms
*Assistant Examiner*—Andy Huynh
(74) *Attorney, Agent, or Firm*—Laurence A. Greenberg; Werner H. Stemer; Ralph E. Locher

(57) ABSTRACT

The gate region of a field effect transistor comprises at least one through hole wherein a nanoelement is provided which is electrically coupled to the source and the drain. The nanoelement may have the conductance thereof controlled by means of the gate, such that the nanoelement forms a channel region of the field effect transistor.

16 Claims, 1 Drawing Sheet

FIELD-EFFECT TRANSISTOR, CIRCUIT CONFIGURATION AND METHOD OF FABRICATING A FIELD-EFFECT TRANSISTOR

CROSS-REFERENCE TO RELATED APPLICATION

This application is a continuation of copending International Application No. PCT/DE01/02708, filed Jul. 19, 2001, which designated the United States and which was not published in English.

BACKGROUND OF THE INVENTION

1. Field of the Invention

The invention relates to a field-effect transistor, a circuit configuration and a method for fabricating a field-effect transistor.

Such a field-effect transistor, such a circuit configuration, and a method for fabricating a field-effect transistor are disclosed by R. Müller in Bauelemente der Halbleiter-Elektronik [Components of Semiconductor Electronics] Springer, ISBN 3-540-06224-6, p. 130–157, 1973.

A customary field-effect transistor has a source region, a drain region and a channel region situated between the source region and the drain region.

Furthermore, a customary field-effect transistor has a gate region, in the case of which, by applying a voltage, that is to say an electrical potential, to the gate region, the electrical conductivity of the channel region is controlled in such a way that the field-effect transistor can be operated either in electrically off-state fashion or in electrically on-state fashion.

A customary field-effect transistor is based on pure semiconductor microelectronics which uses silicon technology, for example. However, conventional silicon microelectronics has physical limits particularly in the context of advancing miniaturization of the electronic components, for example in the context of miniaturization of the dimension of a field-effect transistor.

Furthermore, the known semiconductor technology wherein the semiconductor layers are deposited one above the other and the individual regions of the field-effect transistor are formed in the individual layers by doping the respective regions with doping atoms is not suitable for a true three-dimensional integration in an electrical circuit configuration.

Furthermore, principles of so-called carbon nanotubes are disclosed by C. Dekker in *Carbon-Nanotubes as Molecular Quantum Wires*, Physics Today, p. 22–28, May 1999. A method for fabricating carbon nanotubes by growing the carbon nanotubes on a substrate is disclosed by Jung Sang Suh and Jin Seung Lee in *Highly-Ordered Two-Dimensional Carbon-Nanotube Arrays*, Applied Physics Letters, Vol. 75, Nr. 14, p. 2047–49, October 1999 and by Z. F. Ren, et al. in *Synthesis of Large Arrays of Well-Aligned Carbon Nanotubes on Glass*, SCIENCE, Vol. 282, p. 1105–07, November 1998.

Further reference is had to the disclosure of a method of fabricating a silicon nanowire by N. Wang, et al. in *Si Nanowires Grown from Silicon Oxide*, Chemical Physics Letters, Vol. 299, p. 237–42, 1999.

Finally, D. Goldberg, et al., in Fine Structure of *Boron Nitride Nanotubes Produced from Carbon Nanotubes by a Sustitution Reaction*, Journal of Applied Physics, Vo. 86, p. 2364–2366, 1999, disclose doping a carbon nanotube with boron atoms and nitrogen atoms, so that an electrically insulating boron nitride nanotube is produced from a semiconducting carbon nanotube or a metallically conductive carbon nanotube.

SUMMARY OF THE INVENTION

It is accordingly an object of the invention to provide a field-effect transistor, a circuit configuration, and a method for fabricating a field-effect transistor which overcome the above-mentioned disadvantages of the heretofore-known devices and methods of this general type and which is better suited to three-dimensional integration than field-effect transistors that are based exclusively on the technological principles described by R. Muller, cited above.

With the foregoing and other objects in view there is provided, in accordance with the invention, a field-effect transistor, comprising:
a source region;
a drain region;
a gate region between the source region and the drain region;
the gate region containing conductive material having at least one through hole formed therein;
at least one nanoelement disposed in the through hole and electrically coupled to the source region and the drain region is; and
the nanoelement being arranged and configured such that a conductivity thereof is controlled via the gate region, and the nanoelement forms a channel region.

The problem is solved by means of the field-effect transistor, by means of the circuit configuration, and by means of the method for fabricating a field-effect transistor having the features in accordance with the independent patent claims.

A field-effect transistor has a source region, a drain region and a gate region. The gate region is arranged between the source region and the drain region. The gate region, which is formed from conductive material, for example from a conductive layer with aluminum, titanium, tungsten, gold, silver or an alloy comprising at least one of the abovementioned materials, has at least one through hole, which is also referred to as a pore. In principle, an arbitrary number of through holes are provided in the gate region.

At least one nanoelement which is electrically coupled to the source region and the drain region of the field-effect transistor is provided in the through hole or in the multiplicity of through holes.

In the context of the invention, a nanoelement is to be understood to be, for example, a nanotube and/or a nanowire, for example a semiconducting carbon nanotube or a semiconducting silicon nanowire.

However, the nanoelement may also have a heterostructure with a plurality of regions, preferably a first metallically conductive region, a second electrically conductive region and an electrically insulating region, which is arranged between the first metallically conductive and the second metallically conductive region.

The regions can be formed either in a one-piece structure, for example a carbon nanotube, by forming different electrical properties in different regions of the respective nanotube, or in a silicon nanowire.

However, the heterostructure can also be formed by correspondingly joining together the individual regions as partial elements which altogether produce the heterostructure described above, the joining-together process being carried out with sufficient accuracy.

The invention makes it possible for the first time to use a field-effect transistor which can be used for true three-dimensional integration within an integrated circuit in the context of microelectronics.

Furthermore, the dimension, that is to say the space requirement on a chip area, of such a field-effect transistor is considerably smaller by comparison with a known field-effect transistor, since the nanowire forming the channel region or the nanotube is made very small, that is to say has a diameter of as little as just 1 nm.

In accordance with one refinement of the invention, it is provided that the first metallically conductive region of the nanotube is a metallically conductive carbon nanotube or part of a carbon nanotube which is metallically conductive in the first metallically conductive region. The second metallically conductive region may likewise be a metallically conductive carbon nanotube or a partial region of the carbon nanotube, which also has the first metallically conductive region, the second metallically conductive region likewise being metallically conductive.

Formed between the two metallically conductive regions is an electrically insulating region of the nanotube as a boron nitride nanotube.

For the case where a carbon nanotube with two metallically conductive regions and an electrically insulating region situated between the metallically conductive regions is provided, the respective electrically insulating region is formed by corresponding doping of the respective region with boron atoms and nitrogen atoms, as described by D. Goldberg, et al., supra.

In accordance with one refinement of the invention, the source region may contain a material that acts catalytically for the formation, that is to say the growth or the vapor phase deposition, as described by Suh and Lee, supra, and by Z. F. Ren, et al., supra.

The material that acts catalytically for the formation of the nanotubes may contain nickel, cobalt, iron or an alloy comprising at least one of these above-mentioned materials.

On account of this refinement of the invention, the formation of a nanotube is accelerated to a considerable extent, as a result of which the fabrication of the field-effect transistor is made even more cost-effective.

The nanoelement is configured and arranged in the through hole in such a way that its conductivity can be controlled via the gate region. In this way, the nanoelement clearly forms the channel region of the field-effect transistor.

If a carbon nanotube is used as nanoelement, then the resulting structure, that is to say the field-effect transistor resulting therewith, has the advantage, in particular, that a carbon nanotube can be handled very simply and is stable, so that the susceptibility of such a field-effect transistor to defects is reduced further.

Through the use of a heterostructure, a field-effect transistor is clearly formed which is based on an electrical charge carrier tunneling principle, the tunneling being controllable on account of the electrical potential which is applied to the gate region.

In accordance with a further refinement of the invention, it is provided that the drain region contains nickel, cobalt or an alloy comprising nickel and/or cobalt.

A circuit configuration has at least one field-effect transistor of the type presented above.

Such a circuit configuration has the advantage, in particular, of the increased integration, which is now also possible three-dimensionally in its entirety, and with the associated reduced space requirement, that is to say a considerably increased integration density of the components on a chip.

In a method for fabricating the field-effect transistor described above, a source layer is applied on a substrate, wherein case undoped or doped silicon, glass, quartz, or else sapphire can be used as substrate.

An electrically conductive gate layer is applied on the source layer. In a further step, at least one through hole is formed in the gate layer, preferably by means of dry etching, since, in particular, vertical structures can be etched very exactly when a dry etching method is used to form the through holes in the gate region.

At least one nanoelement which is electrically coupled to the source layer is introduced into the through hole.

In this case, the nanoelement is arranged and configured in such a way that its conductivity can be controlled via the gate region, so that the nanoelement forms the channel region of the field-effect transistor.

For the case where the nanoelement is a carbon nanotube, said nanoelement is grown or else deposited for example on a catalyst material situated on the bottom of the through hole.

As an alternative, provision is made for forming a carbon nanotube outside the through hole and subsequently positioning it mechanically in the through hole, for example using a scanning force microscope in such a way that the carbon nanotube introduced into the through hole comes into electrical contact with the bottom, that is to say with the upper surface of the source layer.

A drain layer is applied on the gate layer in such a way that the drain layer is likewise electrically coupled to the nanoelement.

This can be achieved for example by the nanoelement having a length which is greater than the length of the through hole, so that the nanoelement still extends beyond the surface of the through hole and, consequently, an electrical contact connection of the drain layer to the nanoelement forms automatically when the drain layer is grown or deposited on the gate layer.

Other features which are considered as characteristic for the invention are set forth in the appended claims.

Although the invention is illustrated and described herein as embodied in a field-effect transistor, circuit configuration and method for fabricating a field-effect transistor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1A:
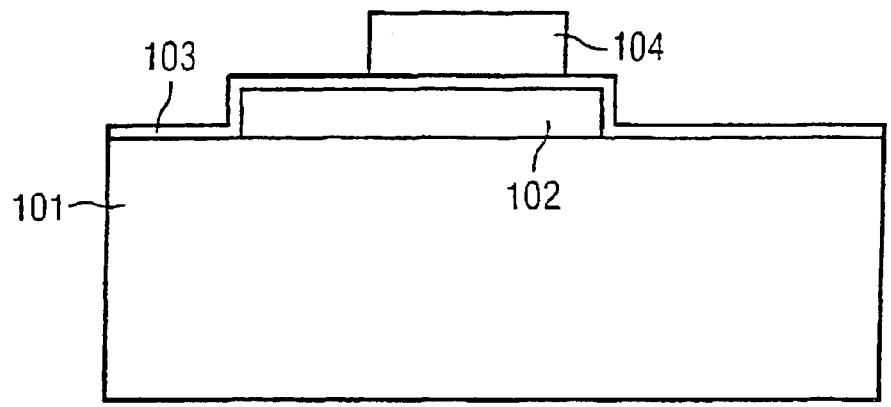
FIGS. 1A to 1C are diagrammatic sectional views showing a field-effect transistor in accordance with an exemplary embodiment of the invention at different points in time during its fabrication process.

Referring now to the figures of the drawing in detail and first, particularly, to FIG. 1A thereof, there is shown an assembly with a substrate, made of silicon dioxide 101 in accordance with this exemplary embodiment.

In alternative embodiments, instead of the silicon dioxide, quartz or sapphire may also be used as substrate 101.

A source layer 102 made of nickel is applied on the substrate 101 by way of a suitable CVD method, that is to say a vapor phase deposition method, or a growth method or by way of vapor deposition or sputtering, and is patterned by way of photolithography. In patterned form, the source layer 102 forms the source region of the field-effect transistor to be formed.

Instead of the nickel, in principle any suitable metal, in particular cobalt or iron, can be used as alternative material for the source layer 102.

In a further step, a dialuminum trioxide layer ($Al_2O_3$, alumina) 103 is deposited on the patterned source layer 102 forming the source electrode and also on the substrate 101.

This dialuminum trioxide layer 103, which is relatively thin compared with the source layer 102, serves as a dielectric which electrically insulates the gate electrode, formed by a gate layer described below, from the source layer 102.

In accordance with this exemplary embodiment, the source layer 102 has a thickness of approximately 100 nm and the dialuminum trioxide layer 103 has a layer thickness of approximately 20 nm.

Still with reference to FIG. 1A, in a further step, an aluminum layer is deposited on the dialuminum trioxide layer 103 and patterned, so that the patterned aluminum layer, referred to below as gate layer 104, constitutes the gate of the field-effect transistor 100 to be formed.

The gate layer 104 likewise has a thickness of about 100 nm and is applied by way of a suitable CVD method or a sputtering method, a vapor deposition method or an epitaxy method.

Instead of the aluminum, in accordance with an alternative embodiment, titanium, tungsten, silver, or gold may be used for the gate layer 104.

Figure 1B:
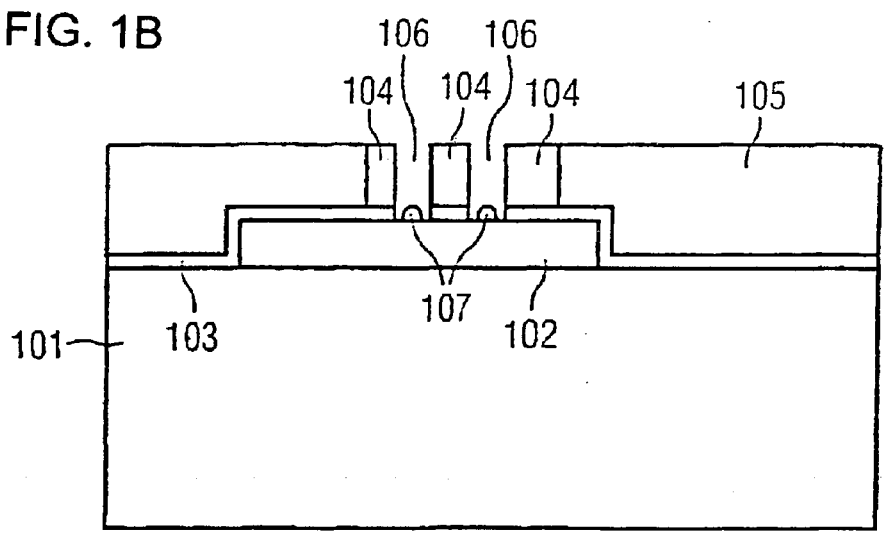

In a further step (cf. FIG. 1B), a further layer 105 made of dialuminum trioxide is deposited by means of a suitable CVD method or a sputtering method or a vapor deposition method and the further layer 105 formed, which, in principle, has an arbitrary thickness, is reduced by means of a chemical mechanical polishing method (CMP method) to a thickness such that the upper surface of the further layer 105 is at the same level as the upper surface of the gate layer 104.

In a further step, in the gate layer 104, by means of, for example, photolithography and self-aligned known constriction methods, photoresist is applied on the gate layer and the further layer 105 and patterning is effected in such a way that, in a further step, holes 106 are etched into the gate layer 105 by means of dry etching.

The through holes 106 formed in this way have a diameter of approximately 1 nm to 10 nm.

The dry etching method is carried out until both the material of the gate layer 104 and the respective underlying material of the dialuminum trioxide layer 103 are removed in the holes 106 formed.

If the source layer 102 used does not have the necessary catalytic properties itself, in a further step, material 107 is applied into the through holes 106, which material acts catalytically with regard to a further described growth or deposition of carbon nanotubes or silicon nanowires in the through hole 106.

In accordance with this exemplary embodiment, nickel, cobalt or iron is used as material 107.

Figure 1C:
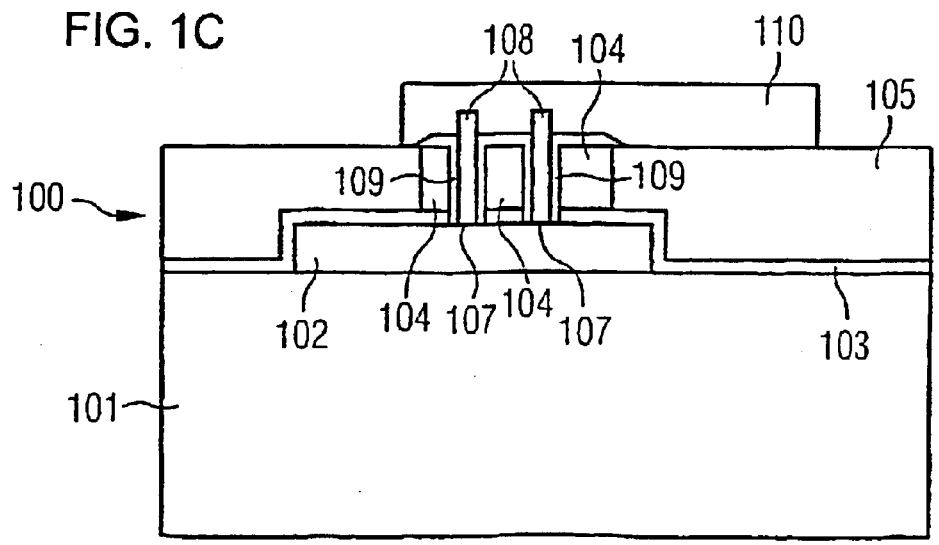

In a further step, as is illustrated in FIG. 1C, by way of the process described by Suh and Lee, supra, at least one single-walled or multi-walled carbon nanotube is deposited in each through hole with the use of the metal 107 that acts catalytically. It will be understood that the process described by Z. R. Ren, et al., supra, can also be used in this connection.

The deposition is effected in such a way that the respective carbon nanotube is electrically coupled to the source layer 102 via the metals 107 that act catalytically.

In accordance with this exemplary embodiment, the carbon nanotubes grown are semiconducting carbon nanotubes.

The conductivity of the carbon nanotubes can be controlled by way of the known field effect by the application of an electrical voltage to the gate region, that is to say to the gate layer 104, so that the carbon nanotubes 108 clearly have the functionality of the channel region of a field-effect transistor.

As an alternative to the carbon nanotubes, silicon nanowires can be grown by way of selective silicon epitaxy into the through holes 106, as described above, in accordance with the process disclosed by N. Wang, et al., supra.

In the context of this invention, silicon nanowires can also be used as channel region of a field-effect transistor by means of a field effect that forms.

In a further step, part of the metal of the gate layer 104, in particular the aluminum, for example, of the gate layer 104, is oxidized, so that a thin oxidized gate layer, for example made of dialuminum trioxide 109, forms between the gate layer, still composed of metal, for example aluminum, and the nanoelements, for example the carbon nanotubes or the silicon nanowires.

In a final step, a further metal layer 110 is deposited as a drain layer, forming the drain of the field-effect transistor, on the oxidized layer 109 and the further layer 105 and is patterned by means of lithographic methods.

The drain layer 110 may have nickel, alternatively cobalt as well.

The carbon nanotubes 108 or the silicon nanowires have a length such that they project beyond the upper surface of the oxidized layer 109 after they have been deposited or grown.

In this way, deposition or application of the drain layer 110 automatically produces an electrical contact with the nanoelement, that is to say for example with the carbon nanotube 108 or with the silicon nanowire.

The foregoing text makes repeated reference to various publications, the disclosures of which are herewith incorporated by reference, to wit:

R. Müller, Bauelemente der Halbleiter-Elektronik [Components of Semiconductor Electronics] Springer, ISBN 3-540-06224-6, p. 130–157, 1973.

C. Dekker, *Carbon-Nanotubes as Molecular Quantum Wires*, Physics Today, p. 22–28, May 1999.

Jung Sang Suh and Jin Seung Lee, *Highly-Ordered Two-Dimensional Carbon-Nanotube Arrays*, Applied Physics Letters, Vol. 75, Nr. 14, p. 2047–49, October 1999.

Z. F. Ren, et al. in *Synthesis of Large Arrays of Well-Aligned Carbon Nanotubes on Glass*, SCIENCE, Vol. 282, p. 1105–07, November 1998.

N. Wang, et al. in *Si Nanowires Grown from Silicon Oxide*, Chemical Physics Letters, Vol. 299, p. 237–42, 1999.

D. Goldberg, et al., *Fine Structure of Boron Nitride Nanotubes Produced from Carbon Nanotubes by a Sustitution Reaction*, Journal of Applied Physics, Vo. 86, p. 2364–2366, 1999.

We claim:

1. A field-effect transistor, comprising a source region;

a drain region;

a gate region between said source region and said drain region;

said gate region containing conductive material having at least one through hole formed therein;

at least one nanoelement disposed in said through hole and electrically coupled to said source region and said drain region; and said nanoelement being arranged and configured such that a conductivity thereof is controlled via said gate region, and said nanoelement forms a channel region.

2. The field-effect transistor according to claim 1, wherein said nanoelement comprises at least one of a nanotube and a nanowire.

3. The field-effect transistor according to claim 1, wherein said gate region is a conductive layer.

4. The field-effect transistor according to claim 1, wherein said nanoelement comprises a semiconducting nanowire.

5. The field-effect transistor according to claim 4, wherein said nanowire is a silicon nanowire.

6. The field-effect transistor according to claim 1, wherein said nanoelement comprises a semiconducting nanotube.

7. The field-effect transistor according to claim 6, wherein said nanotube is a carbon nanotube.

8. The field-effect transistor according to claim 1, wherein said nanoelement has a heterostructure, with:

a first metallically conductive region;

a second metallically conductive region; and an electrically insulating region between said first metallically conductive region and said second metallically conductive region.

9. The field-effect transistor according to claim 8, wherein:

said first metallically conductive region of said nanotube is a metallically conductive carbon nanotube;

said second metallically conductive region of said nanotube is a metallically conductive carbon nanotube; and said electrically insulating region of said nanotube is a boron nitride nanotube.

10. The field-effect transistor according to claim 1, wherein said source region contains a material acting catalytically for forming a nanotube.

11. The field-effect transistor according to claim 10, wherein said material contains at least one metal selected from the group consisting of nickel, cobalt, iron, and an alloy thereof.

12. The field-effect transistor according to claim 1, wherein said gate region contains at least one material selected from the group consisting of aluminum, titanium, tungsten, gold, silver, and an alloy thereof.

13. The field-effect transistor according to claim 1, wherein said drain region contains at least one material selected from the group consisting of nickel, cobalt, and an alloy thereof.

14. A circuit configuration comprising at least one field-effect transistor according to claim 1.

15. A method of fabricating a field-effect transistor, which comprises:

forming a source layer on a substrate;

forming an electrically conductive gate layer is on the source layer;

forming at least one through hole in the gate layer;

introducing at least one nanoelement into the through hole, the nanoelement being electrically coupled to the source layer and arranged and configured such that a conductivity thereof is controllable via the gate region, so that the nanoelement forms a channel region; and applying a drain layer on the gate layer and electrically coupling the drain layer to the nanoelement.

16. The method according to claim 15, wherein the step of forming the through hole comprises dry etching.

* * * * *